(12) United States Patent
Oganesian et al.

(10) Patent No.: US 9,041,133 B2
(45) Date of Patent: May 26, 2015

(54) BSI IMAGE SENSOR PACKAGE WITH EMBEDDED ABSORBER FOR EVEN RECEPTION OF DIFFERENT WAVELENGTHS

(75) Inventors: Vage Oganesian, Sunnyvale, CA (US);
Belgacem Haba, Charlotte, NC (US);
Ilyas Mohammed, Charlotte, NC (US);
Piyush Savalia, Charlotte, NC (US);
Craig Mitchell, Charlotte, NC (US)

(73) Assignee: NAN CHANG O-FILM OPTOELECTRONICS TECHNOLOGY LTD, Nanchang (CN)

( * ) Notice: Subject to any disclaimer, the term of this patent is extended or adjusted under 35 U.S.C. 154(b) by 146 days.

(21) Appl. No.: 13/111,258

(22) Filed: May 19, 2011

(65) Prior Publication Data
US 2012/0199925 A1 Aug. 9, 2012

Related U.S. Application Data

(60) Provisional application No. 61/439,102, filed on Feb. 3, 2011.

(51) Int. Cl.
*H01L 31/0232* (2014.01)
*H01L 27/146* (2006.01)

(52) U.S. Cl.
CPC .... *H01L 27/14609* (2013.01); *H01L 27/14621* (2013.01); *H01L 27/14645* (2013.01); *H01L 27/1461* (2013.01); *H01L 27/1464* (2013.01)

(58) Field of Classification Search
CPC .................. H01L 27/14609; H01L 27/14621; H01L 27/1464; H01L 27/1461
USPC ................. 257/E27.13, 432, E31.127; 438/70
See application file for complete search history.

(56) References Cited

U.S. PATENT DOCUMENTS 3,617,753 A 11/1971 Kato et al.
5,119,227 A 6/1992 Dawson et al.
(Continued)

FOREIGN PATENT DOCUMENTS

JP 2006080457 A 3/2006
JP 2009244862 A 10/2009
(Continued)

OTHER PUBLICATIONS

I-Micronews—Advanced Packaging: 3D IC, WLP & TSV : Sony Backside Illuminated (BSI) CMOS Image, 2 pages, Jun. 2009.
(Continued)

*Primary Examiner* — Kimberly Rizkallah
*Assistant Examiner* — Alexander Belousov
(74) *Attorney, Agent, or Firm* — Novak Druce Connolly Bove + Quigg LLP

(57) ABSTRACT

A microelectronic image sensor assembly for backside illumination and method of making same are provided. The assembly includes a microelectronic element having contacts exposed at a front face and light sensing elements arranged to receive light of different wavelengths through a rear face. A semiconductor region has an opening overlying at least one of first and second light sensing elements, the semiconductor region having a first thickness between the first light sensing element and the rear face and a second thickness between the second light sensing element and the rear face. A light-absorbing material overlies the semiconductor region within the opening above at least one of the light sensing elements such that the first and second light sensing elements receive light of substantially the same intensity.

29 Claims, 10 Drawing Sheets

(56) References Cited

U.S. PATENT DOCUMENTS

| | | | |
|---|---|---|---|
| 5,217,597 A | 6/1993 | Moore et al. | |
| 5,592,018 A | 1/1997 | Leedy | |
| 5,808,350 A | 9/1998 | Jack et al. | |
| 5,936,268 A | 8/1999 | Cockrum et al. | |
| 6,169,319 B1 * | 1/2001 | Malinovich et al. | 257/447 |
| 7,531,884 B2 * | 5/2009 | Kim | 257/440 |
| 7,638,852 B2 | 12/2009 | Hsu et al. | |
| 2005/0258351 A1 | 11/2005 | Ma | |
| 2006/0043519 A1 | 3/2006 | Ezaki | |
| 2006/0145223 A1 | 7/2006 | Ryu | |
| 2007/0152250 A1 | 7/2007 | Kim | |
| 2007/0164384 A1 * | 7/2007 | Maruyama et al. | 257/431 |
| 2007/0262364 A1 * | 11/2007 | Hsu et al. | 257/291 |
| 2008/0079108 A1 | 4/2008 | Hsu et al. | |
| 2008/0159658 A1 | 7/2008 | Yun | |
| 2008/0245967 A1 * | 10/2008 | van Asselt et al. | 250/370.09 |
| 2008/0265349 A1 | 10/2008 | Kasano et al. | |
| 2009/0078939 A1 * | 3/2009 | Yamazaki et al. | 257/59 |
| 2009/0090988 A1 | 4/2009 | Ohgishi | |
| 2009/0096049 A1 | 4/2009 | Oshiyama et al. | |
| 2009/0121288 A1 * | 5/2009 | Patruno | 257/347 |
| 2009/0284630 A1 | 11/2009 | Itonaga | |
| 2009/0294886 A1 | 12/2009 | Hsu et al. | |
| 2009/0295979 A1 * | 12/2009 | Matsuo et al. | 348/335 |
| 2009/0302409 A1 | 12/2009 | Qian et al. | |
| 2010/0067827 A1 | 3/2010 | Ozcan et al. | |
| 2010/0140733 A1 | 6/2010 | Lee et al. | |
| 2010/0148290 A1 | 6/2010 | Park | |
| 2010/0171191 A1 | 7/2010 | Lee | |
| 2010/0176475 A1 | 7/2010 | Sano et al. | |
| 2010/0193669 A1 | 8/2010 | Yamaguchi et al. | |
| 2010/0270636 A1 | 10/2010 | Huang et al. | |

FOREIGN PATENT DOCUMENTS

| | | |
|---|---|---|
| JP | 2010034141 A | 2/2010 |
| JP | 2010153658 A | 7/2010 |
| JP | 2010226126 A | 10/2010 |
| KR | 10-0278983 | 4/2000 |
| KR | 2000-0020864 A | 4/2000 |
| KR | 10-0658930 | 12/2006 |
| KR | 10-0660714 B1 | 12/2006 |
| KR | 20070061530 A | 6/2007 |
| KR | 20070109895 A | 11/2007 |
| KR | 10-0967648 | 6/2009 |
| KR | 2009-0068403 A | 6/2009 |
| KR | 20090068934 A | 6/2009 |
| KR | 20100109405 A | 10/2010 |

OTHER PUBLICATIONS

International Search Report Application No. PCT/US2011/035855, dated Sep. 26, 2011.
International Search Report Application No. PCT/US2011/035732, dated Nov. 9, 2011.
International Search Report Application No. PCT/US2011/035732, dated Aug. 30, 2011.
U.S. Appl. No. 13/114,243.
U.S. Appl. No. 13/020,328.

* cited by examiner

BSI IMAGE SENSOR PACKAGE WITH EMBEDDED ABSORBER FOR EVEN RECEPTION OF DIFFERENT WAVELENGTHS

CROSS-REFERENCE TO RELATED APPLICATIONS

This application claims the benefit of the filing date of U.S. Provisional Patent Application No. 61/439,102 filed Feb. 3, 2011, the disclosure of which is hereby incorporated herein by reference.

BACKGROUND OF THE INVENTION

The present invention relates to backside illuminated ("BSI") image sensors, and in particular, the formation of same for even reception of different wavelengths of light.

Image sensors attempt to capture incident light into signals that accurately record intensity and color information with good spatial resolution. Front side illuminated ("FSI") image sensors have photodetectors on silicon chips over which a circuitry layer including many levels of wiring is built up. In FSI image sensors, the light reaching the photodetectors must pass through the circuitry layer first. One limitation of FSI image sensors is that the circuitry layer can limit the exposed area, or aperture, of each pixel. As pixel sizes shrink in FSI image sensors due to increasing demands for higher numbers of pixels and smaller chip sizes, the ratio of pixel area to the overall sensor area decreases. This can reduce the quantum efficiency of the sensor.

This concern is addressed somewhat by backside illumination image sensors in which light enters the sensor from the back of the chip, thus avoiding the circuitry layer. However, in BSI image sensors, the light must still pass through the silicon that lies between the back of the chip and the photodetectors. This can also pose particular challenges, as will be further described herein. Further improvements can be made to BSI image sensors which may help to overcome deficiencies of current devices.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

BRIEF SUMMARY OF THE INVENTION

Embodiments of the invention herein can include a microelectronic element having a semiconductor region with openings overlying some of the light sensing elements therein. By providing a light-absorbing material within the openings, the light received by each photodiode can be made more uniform for light of different wavelengths, such that the light sensing elements, e.g., photodiodes, receive light of different wavelengths at substantially the same intensity.

A first aspect of the present invention is a microelectronic image sensor assembly, including a microelectronic element having a front face, contacts exposed at the front face, a semiconductor region having a first surface adjacent the front face, and the microelectronic element having a rear face remote from the front face, and first and second light sensing elements arranged to receive light of first and second different wavelengths, respectively, through the rear face. The semiconductor region has an opening overlying at least the second light sensing element such that the semiconductor region has a first thickness between the first light sensing element and the rear face and a second thickness less than the first thickness between the second light sensing element and the rear face. The microelectronic element further includes a light-absorbing material overlying the semiconductor region at least within the opening above the second light sensing element.

In accordance with certain embodiments of this first aspect, the assembly may further include an antireflective coating overlying the rear face of the semiconductor region, wherein the light-absorbing material overlies the antireflective coating. The first and second different wavelengths may correspond to different colors of light selected from the group consisting of red, blue, and green. A surface of the semiconductor region may be exposed at the rear face of the microelectronic element and the light-absorbing material may be at least substantially co-planar with the surface of the semiconductor region.

The assembly may further include a third light sensing element arranged to receive light of a third wavelength different from the first and second wavelengths through the rear face, wherein the semiconductor region has a third thickness between the third light sensing element and the rear face which is less than the second thickness, wherein the light-absorbing material overlies the semiconductor region above the third light-sensing element, such that the third light sensing element is arranged to receive the light having the third wavelength with substantially the same intensity as the first and second light sensing elements are arranged to receive the first and second wavelengths, respectively. The first, second, and third wavelengths may correspond to different colors selected from the group consisting of red, blue, and green. The first wavelength of light may correspond to blue light. The second wavelength of light may correspond to green light and the third wavelength may correspond to red light, and the first thickness may be more than 5 times the third thickness and the second thickness may be at least 1.5 times the third thickness.

The second thickness may be zero. The light-absorbing material may have a higher absorption value per unit depth than the semiconductor region. The light-absorbing material may be arranged to reduce an amount of light passed to one or more of the light sensing elements. The assembly may further include a substrate mounted to the front face of the microelectronic element, the substrate having a coefficient of thermal expansion of less than 10 parts per million/° C. ("ppm/° C."), and conductive elements extending from the contacts of the microelectronic element through the substrate and exposed at a surface of the substrate remote from the microelectronic element, the conductive elements including unit contacts.

The assembly may further include a color filter array including at least a first filter and a second filter overlying the light first and second sensing elements, respectively, the first and second filters having first and second different passbands selecting the first and second wavelengths, respectively. The first and second wavelengths may correspond to different ones of: red, blue, or green wavelengths. The assembly may further include an array of microlenses including first and second microlenses overlying the first and second filters, respectively. The assembly may further include a transparent cover overlying the microlenses, a cavity being disposed between the transparent cover and the microlenses.

A second aspect of the present invention is a system including a structure as described above and one or more other electronic components electrically connected to the structure. In accordance with certain embodiments of this second aspect, the system may further include a housing, the structure and the other electronic components being mounted to the housing.

A third aspect of the present invention is a method of making a microelectronic image sensor assembly, including patterning a rear face of a semiconductor region of a microelectronic element having contacts exposed at a front face of the microelectronic element opposite the rear face, the microelectronic element having first and second light sensing elements adjacent the front face, the patterning performed such that the semiconductor region has an opening overlying at least the second light sensing element, such that the semiconductor region has a first thickness overlying the first light sensing element and a second thickness less than the first thickness overlying the second light sensing element; and forming a light-absorbing material region at least within the opening above the second light sensing element.

In accordance with certain embodiments of this third aspect, the method may further include forming an antireflective coating overlying the semiconductor region prior to the step of forming the light-absorbing material region, wherein the light-absorbing material region may be formed over at least a portion of the antireflective coating. The first and second wavelengths may correspond to different colors of light selected from the group consisting of red, blue, and green. The step of patterning may form the opening overlying at least the second light sensing element from another portion of the semiconductor region having the first thickness. The microelectronic element may include a third light sensing element arranged to receive light of a third wavelength different from the first and second wavelengths through the rear face, wherein the step of patterning the semiconductor region is performed such that the semiconductor region has a third thickness greater than the second thickness between the third light sensing element and the rear face, and the step of forming the light-absorbing material region may form at least a portion of the light-absorbing material region overlying the third light sensing element, such that the third light sensing element is arranged to receive the light having the third wavelength with substantially the same intensity as the first and second light sensing elements are arranged to receive the first and second wavelengths, respectively. The first, second, and third wavelengths may correspond to different colors selected from the group consisting of red, blue, and green.

The step of forming the light-absorbing material region may include forming the light-absorbing material to reduce an amount of light passed to one or more of the light sensing elements. The method may further include mounting a substrate to the front face of the microelectronic element, the substrate having a coefficient of thermal expansion of less than 10 parts per million/° C. ("ppm/° C."), and forming conductive elements extending from the contacts of the microelectronic element through the substrate and exposed at a surface of the substrate remote from the microelectronic element, the conductive elements including unit contacts. The method may further include providing a color filter array including at least a first filter and a second filter overlying the first and second light sensing elements, respectively, the first and second filters having first and second different passbands selecting the first and second wavelengths, respectively. The first and second wavelengths may correspond to different ones of: red, blue, or green wavelengths. The method may further include forming an array of microlenses including first and second microlenses overlying the first and second filters, respectively. The method may further include mounting a transparent cover overlying the microlenses, a cavity being disposed between the transparent cover and the microlenses.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

DETAILED DESCRIPTION

Figure 1:
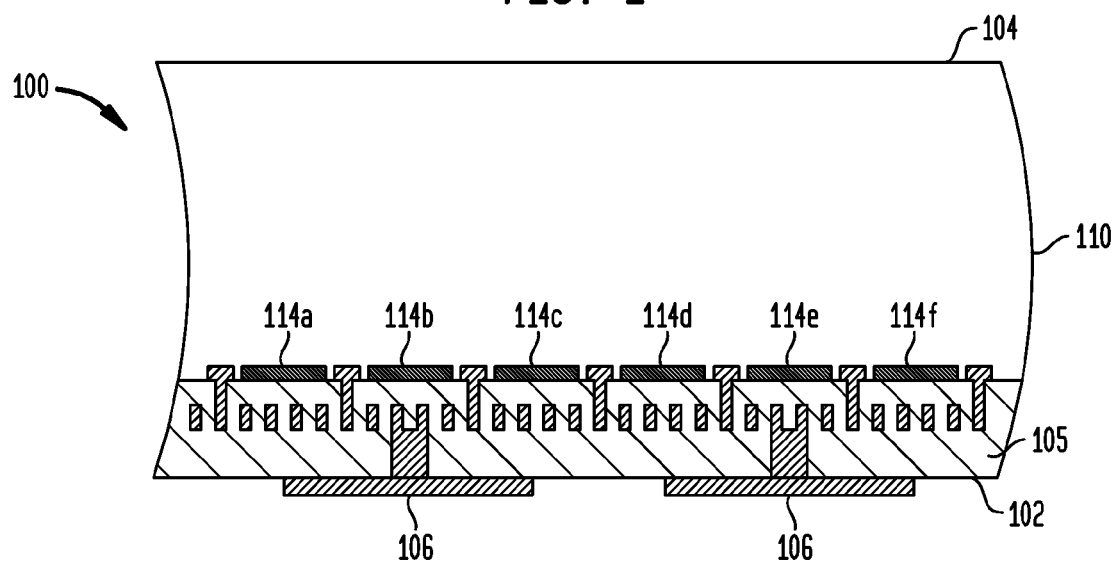
FIGS. 1 and 2 are sectional views of a microelectronic element in accordance with a first embodiment of the present invention.

One particular challenge of designing BSI image sensors and assemblies incorporating them is to ensure that the light sensing elements therein adequately receive the different wavelengths of light for which they are designed to operate. In color BSI image sensors, some light sensing elements are arranged to sense blue light, while others sense red or green light. A particular challenge of color BSI image sensors is that the semiconductor material through which the light passes to reach the light sensing elements absorbs different wavelengths of light at substantially different rates. For example, silicon absorbs visible light in the blue wavelength range at a rate about five times the rate silicon absorbs visible light in the red wavelength range. Consequently, when a BSI image sensor has a uniform thickness of silicon overlying the light sensing elements, the light sensing elements which receive the blue light receive substantially lower intensity than the light sensing elements which receive the red light. Since the green wavelength range lies between blue and red, the light sensing elements which receive the green light receive substantially lower intensity than the light sensing elements which receive the red light.

Particular embodiments of the invention address these challenges. For example, FIGS. 1-7 depict various stages in formation of a microelectronic image sensor assembly 10 according to one embodiment of the present invention. In the embodiment shown in FIG. 7, a microelectronic image sensor assembly 10 is provided which includes a microelectronic element 100 having a front face 102 and a rear face 104 remote from front face 102. One or more contacts 106 are exposed at front face 102 of the microelectronic element. A circuitry portion 105 typically includes a plurality of wiring levels and provides electrical interconnection between internal elements within the microelectronic element 100 and between such internal elements and the contacts 106.

A plurality of light sensing elements ("LSEs") 114, i.e., 114a, 114b, 114c, 114d, 114e, and 114f as shown according to their respective positions in the assembly, are arranged to receive light through the rear face 104. Hereinafter, the LSEs at these positions may be collectively referred to as LSEs "114a-f". The LSEs typically are photodiodes but can be other types of photodetectors. Such devices typically are active circuit elements having at least portions formed in a semiconductor region 110 of the microelectronic element 100. The circuitry portion 105 provides interconnection between the LSEs and the contacts 106 so as to permit signals representing the output of the LSEs to be output via the contacts. Typically, the image sensor assembly 10 contains thousands or millions of LSEs, such that the arrangement seen in FIG. 7 can be repeated thousands or millions of times. As arranged within the microelectronic assembly, some of the LSEs are arranged to receive light of a first wavelength or first band of wavelengths, while other LSEs are arranged to receive light of a second wavelength of second band of wavelengths different from the first wavelength or first band. Still other LSEs can be arranged to receive light of a third wavelength or third band of wavelengths which is different from each of the first and second wavelengths or first and second bands.

In one embodiment, each of the LSEs can be identical and be designed to operate over a fairly wide range of wavelengths, and the microelectronic assembly 10 can include features which restrict the light that LSEs receive to narrower ranges of wavelengths or to particular wavelengths. For example, the assembly 10 can include a color filter array which includes filters 108a, 108b, 108c, 108d, 108e, and 108f (collectively, "108a-f") overlying respective ones of the LSEs 114a, 114b, 114c, 114d, 114e, and 114f. At least some of such filters 108a-f have different passbands which select corresponding different wavelengths. For example, filter 108a can have a passband which selects blue wavelength light, therefore selectively transmitting blue wavelength light while blocking the transmission of light for wavelengths other than blue wavelength. Similarly, filter 108b can have a passband which selects green wavelength light, and selectively transmits green wavelength light while blocking the transmission of light for wavelengths other than for green wavelength. Finally, filter 108c can have a passband which selects red wavelength light, and selectively transmits red wavelength light while blocking the transmission of light for wavelengths other than for red wavelength. There may be a small overlap or no overlap between the passbands of the filters. In the embodiment shown in FIG. 7, filters 108d, 108e and 108f may function similarly to filters 108a, 108b and 108c, respectively, such that filters 108a, 108d transmit blue wavelength light, filters 108b, 108e transmit green wavelength light and filters 108c, 108f transmit red wavelength light.

Figure 7:
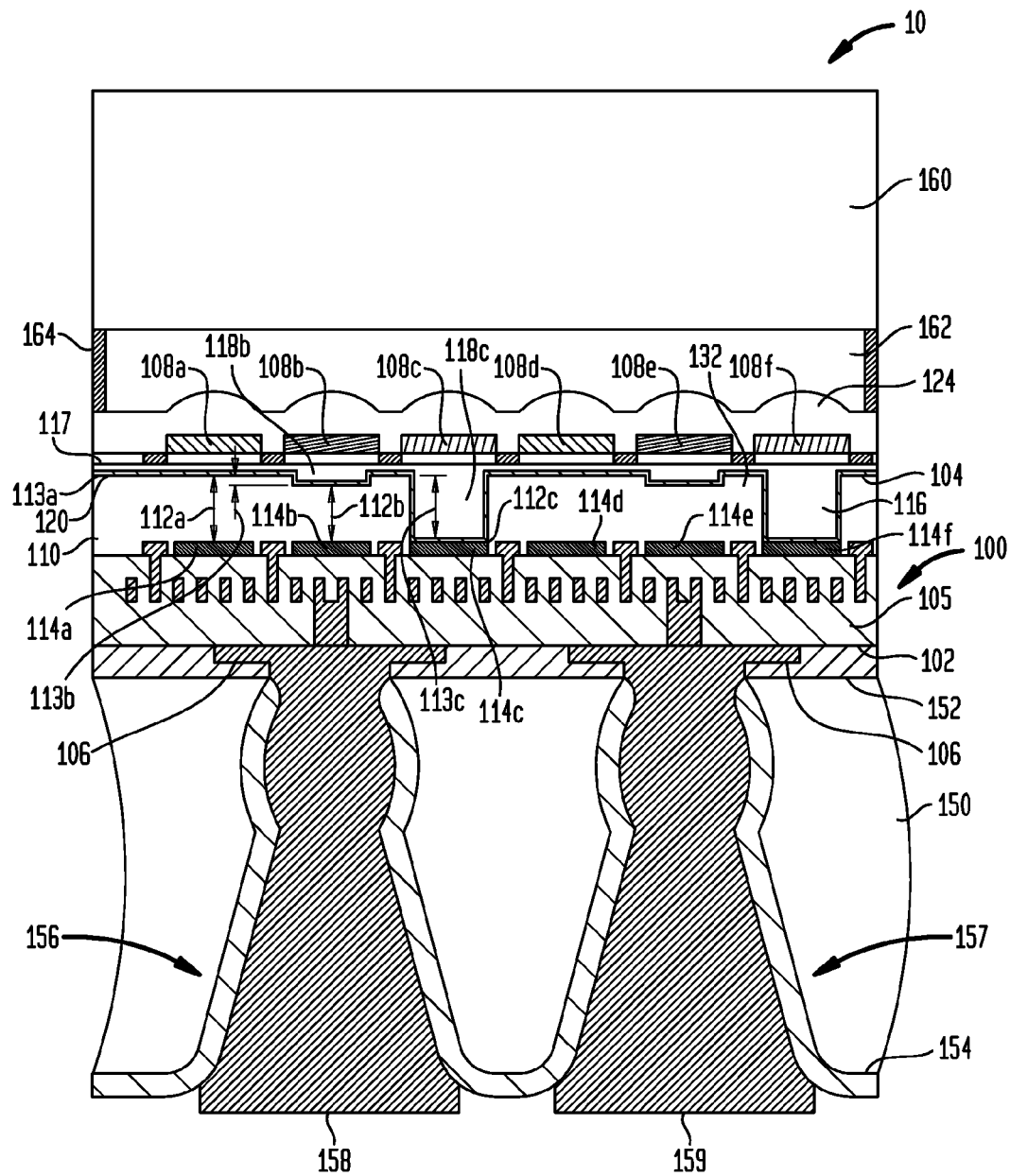
FIG. 7 is a sectional view of a microelectronic image sensor assembly including the element of FIG. 6.

In one embodiment, a semiconductor region 110 may consist essentially of silicon. As seen in FIG. 7, the semiconductor region 110 has a rear face 104 which has features therein, such that the thickness of the semiconductor region 110 above respective LSEs varies, and the distance or height of the rear face 104 above the LSEs varies from one location to another. For example, the semiconductor region has a thickness 112b above LSE 114b, i.e., between LSE 114b and rear face 104, while the semiconductor region has a different thickness 112a between LSE 114a and rear face 104.

Microelectronic element 100 further includes a light-absorbing material 116 within an opening in the semiconductor region 110 adjacent at least one of the LSEs 114. As shown in FIG. 7, assembly 10 is constructed such that the thicknesses of semiconductor region 110, such as thicknesses 112b, 112c, can be defined by openings 118b, 118c (opening 118c extending substantially all the way to LSE 114c in FIG. 7) patterned in the rear face 104. Thus, the openings 118b, 118c can be at least substantially filled by the light-absorbing material 116. In one embodiment, complementary thicknesses 113a-f of light-absorbing material 116 can fill the patterned or removed portion of semiconductor region 110. Light-absorbing material 116 can be a doped silicon material that typically absorbs the various wavelengths of light, e.g., red, green, and blue, that the image sensor is designed to detect. Suitable materials having higher absorption coefficients than the silicon material of which the semiconductor region 110 between the LSEs and the rear face 103 typically consists include various forms of doped silicon, such as indium-doped silicon or boron-doped silicon, for example. Still other examples of materials that can serve as one or more increased materials having increased absorption coefficients include gallium arsenide (GaAs), indium phosphide (InP), germanium (Ge), etc., and other materials, such as aluminum oxide or other ceramics, among others.

Light-absorbing material 116 can have a higher absorption value per unit depth than semiconductor region 110 and can be arranged to reduce an amount of light passed to one or more of LSEs 114. The absorption of light by light-absorbing material 116 can occur at a substantially similar rate regardless of wavelength, and is greater than the absorption of light by semiconductor region 110. Assembly 10 may include an antireflective coating 120 overlying semiconductor region 110, the antireflective coating separating the semiconductor region 110 from the light-absorbing material 116.

The different thicknesses 112b, 112a of semiconductor region 110 can affect the light passing therethrough. Similarly, the different amounts of light-absorbing material 116 overlying each thickness 112 can also affect the passing light. By making the thickness of the semiconductor region 110 and the amount of light-absorbing material 116 different, the greater absorption rate of shorter (e.g., blue) wavelengths by the semiconductor material, e.g. silicon, can be compensated by a corresponding decreased amount of light-absorbing material 116 above the light sensing elements which receive the blue light, which in turn corresponds to a greater thickness of the silicon since the total distance between LSE 114 and filter 108 is substantially the same.

The openings 118 can extend towards respective ones of the LSEs from substantially planar portions of the rear face which have the greatest thickness 112a. Thus, the thickness 112 above some LSEs, e.g., thickness 112a overlying LSE 114a, can be the thickness of the semiconductor region 110 at the substantially planar portion of the rear face from which the openings, e.g., openings 118b, 118c, extend. Above particular LSEs, e.g., LSE 114c and LSE 114f, most, or even substantially all, of the semiconductor region 110 between such LSE 114c and the rear face 104 may be removed, such that the thickness 112c may be at or close to zero.

As discussed above, semiconductor materials such as silicon can absorb shorter wavelength light, e.g., blue light, at a much greater rate than red light. To compensate, a larger amount of light-absorbing material may be disposed over the light sensing element assigned to red light. For example, the absorption rate of blue light in silicon is about five times the absorption rate of red light. In addition, the absorption rate of blue light in silicon is about 1.5 times the absorption rate of green light. Thus, red light that passes through filter 108c passes through a greater thickness of light-absorbing material 116 than does the green light which passes through filter 108b. In addition, the green light passes through a greater thickness of light-absorbing material 116 than does the blue light which passes through filter 108a. In this way, the products of the absorption rates of the light-absorbing material for different wavelengths and the corresponding thicknesses of the light-absorbing material, respectively, can be made to compensate for differences in the absorption of the respective wavelengths by the semiconductor region 110. In this way, the intensity of light received by each LSE 114a-f can be substantially the same despite the differences in the wavelengths each LSE receives and despite the different absorption rates of the semiconductor material for each of the different wavelengths.

Certain benefits can arise from such operation. With each LSE receiving substantially the same intensity of light as any other regardless of the wavelength, transmission becomes homogenized, with more uniform transmission of photons to the underlying photodiodes. Also, some light sensing elements, e.g., those arranged to receive blue light, can collect more photons without having to increase the area of the assembly. In one embodiment, any variation in the transmitted intensity of the light of different wavelengths, e.g., red, green, or blue wavelengths, to the respective LSEs, can be less than thirty percent across all the different wavelengths received by the LSEs. In a particular example, the variation in transmitted intensity to the LSEs of all the different wavelengths of light can be less than ten percent.

As further depicted in FIG. 7, front face 102 of microelectronic element 100 can be mounted to a first surface 152 of a substrate 150. Substrate 150 preferably has a coefficient of thermal expansion of less than 10 parts per million/° C. ("ppm/° C."). A second surface 154 of substrate 150 is remote from first surface 152. Conductive vias 156, 157 extend from first surface 152 to second surface 154. The vias 156 can be aligned with contacts 106 exposed at front face 102 of microelectronic element 100 or in a variation thereof, may not be aligned with the contacts. Metal elements extend within vias 156, 157 to electrically connect contacts 106 with contact portions 158, 159 exposed at second surface 154 of substrate 150.

As further shown in FIG. 7, a microlens 124 of a microlens array can overlie each filter 108 and help to focus light onto a respective LSE 114. Overlying the microlenses 124 is a transparent cover 160 or other element comprised of glass or other transparent material. Incoming light passes through cover 160 prior to passing through microlenses 124 and being filtered according to different wavelengths by filters 108a-f. A cavity 162 can be disposed between cover 160 and microlenses 124. Cavity 162 can be filled with air or gas. A supporting structure 164 can surround the cavity and support cover 160 above microelectronic element 100. In a particular embodiment, the transparent element 160 can have features (not shown) which allow it to serve an optical function, such as a refractive or diffractive optical element for the light which passes through it.

Figure 2:
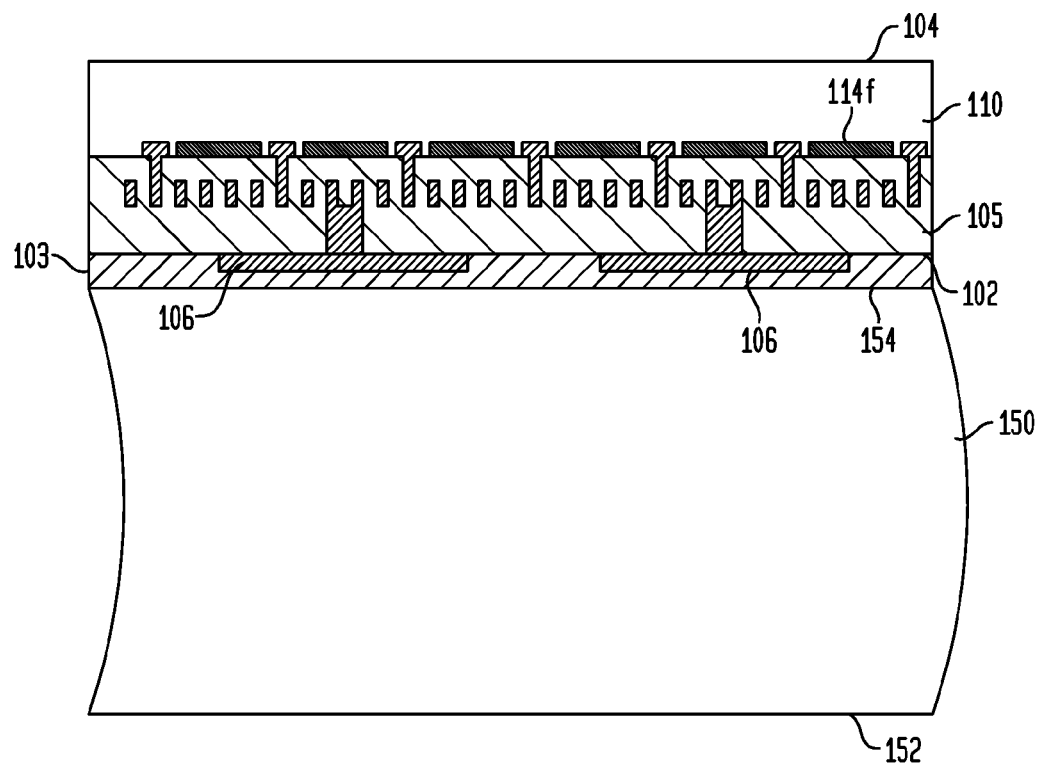

A method of making assembly 10 will now be described with reference to FIGS. 1-7. A microelectronic element 100 (FIG. 1), e.g., a wafer including semiconductor region 110, light sensing elements 114a-f, circuitry portion 105, and contacts 106 thereon, shown in FIG. 1, can be bonded to substrate 150 (FIG. 2), using an adhesive 103 or other dielectric material. Semiconductor region 110 can then be thinned, as shown in FIG. 2, such that the thickness of the semiconductor region which remains between LSEs 114 and the rear face 104 is now relatively small compared to the original thickness of the wafer as shown in FIG. 1.

Figure 3:
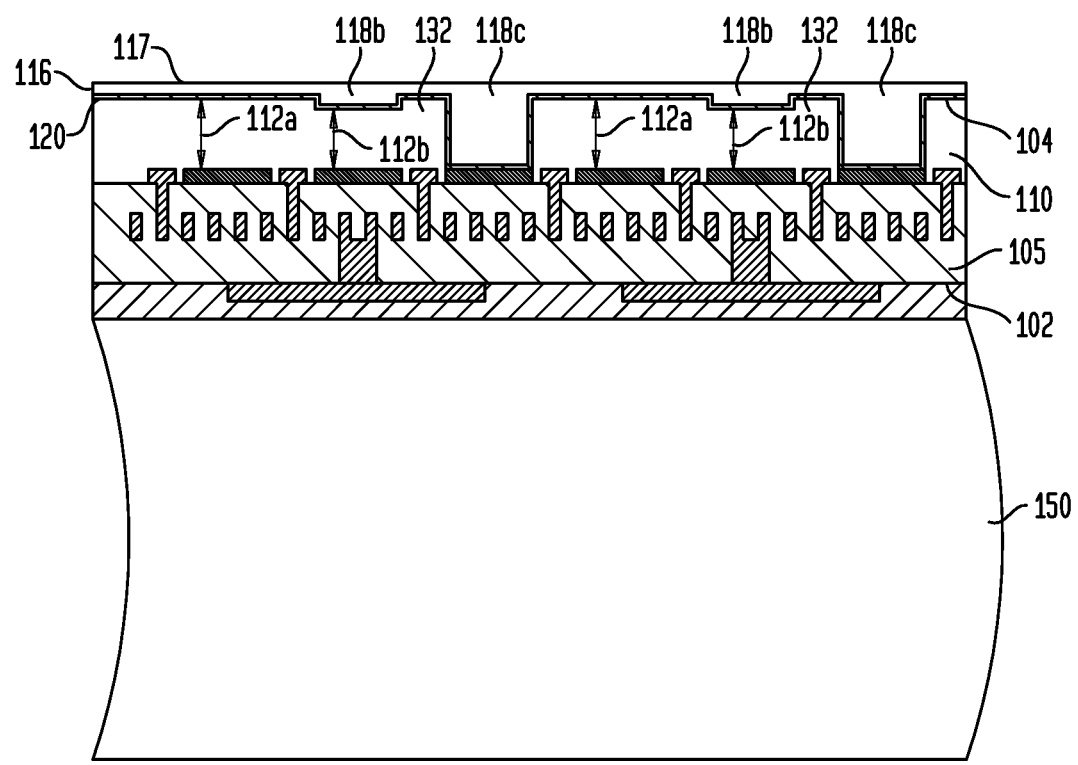
FIG. 3 is a sectional view of the element of FIGS. 1 and 2 having a patterned semiconductor region and an absorptive material.

Then, as seen in FIG. 3, semiconductor region 110 can then be patterned, such as by etching, to form openings 118b, 118c in the rear face 104, such that the semiconductor region has thickness 112a overlying light sensing element 114a and thickness 112b overlying light sensing element 114b. In certain areas, the thickness 112a of the semiconductor region 110 remaining above some LSEs, e.g., LSE 114a, can be the thickness of the semiconductor region between openings in the rear face, e.g., the thickness 112a between opening 118b and opening 118c to the left of opening 118b in FIG. 4. Antireflective coating 120 can be deposited over semiconductor region 110 such that it conformally covers the rear face 104, including the features therein, i.e. covering surfaces within the openings and portions of the rear face 104 between the openings. In a particular example, without limitation, the antireflective coating 120 can be formed by sputtering.

As seen in FIG. 3, light-absorbing material 116 can be formed within at least the various openings in semiconductor region 110 adjacent at least one of light sensing elements 114. In a particular example, the light-absorbing material may fill the openings. The light-absorbing material 116 can be formed by spin coating, spray coating, screening, or other process. Light-absorbing material 116 can be formed to have an at least substantially planar major surface 117 overlying each of light sensing elements 114 and extending above the substantially planar portions of the rear face 104 between the openings. In such case, the surface 117 is a substantially planar surface of the microelectronic element.

Figure 4:
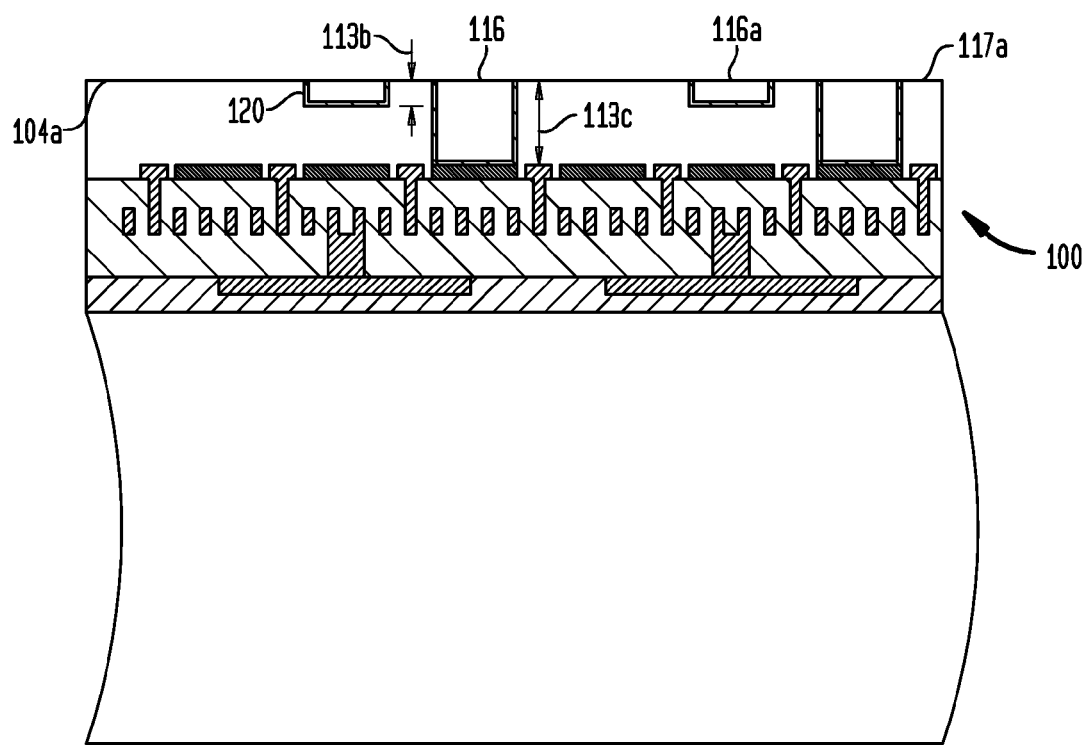
FIG. 4 is a sectional view of another embodiment of the element shown in FIG. 3.

Alternatively, as shown in FIG. 4, the light-absorbing material 116 may be formed to fill the openings and have a surface which is at least substantially co-planar with an exposed surface of the antireflective coating 120. In such case, the microelectronic element has a substantially planar surface 117a at which portions of the antireflective coating 120 and the light-absorbing material 116 can be exposed. Still referring to FIG. 4, in another variation, the antireflective coating 120 may not be present at a portion 104a of the rear face, and such portion 104a can be exposed at a substantially planar surface 117a of the microelectronic element 100. The surface 116a of the light-absorbing material 116 can be exposed and at least substantially planar with the exposed portion 104a of the semiconductor region.

Figure 5:
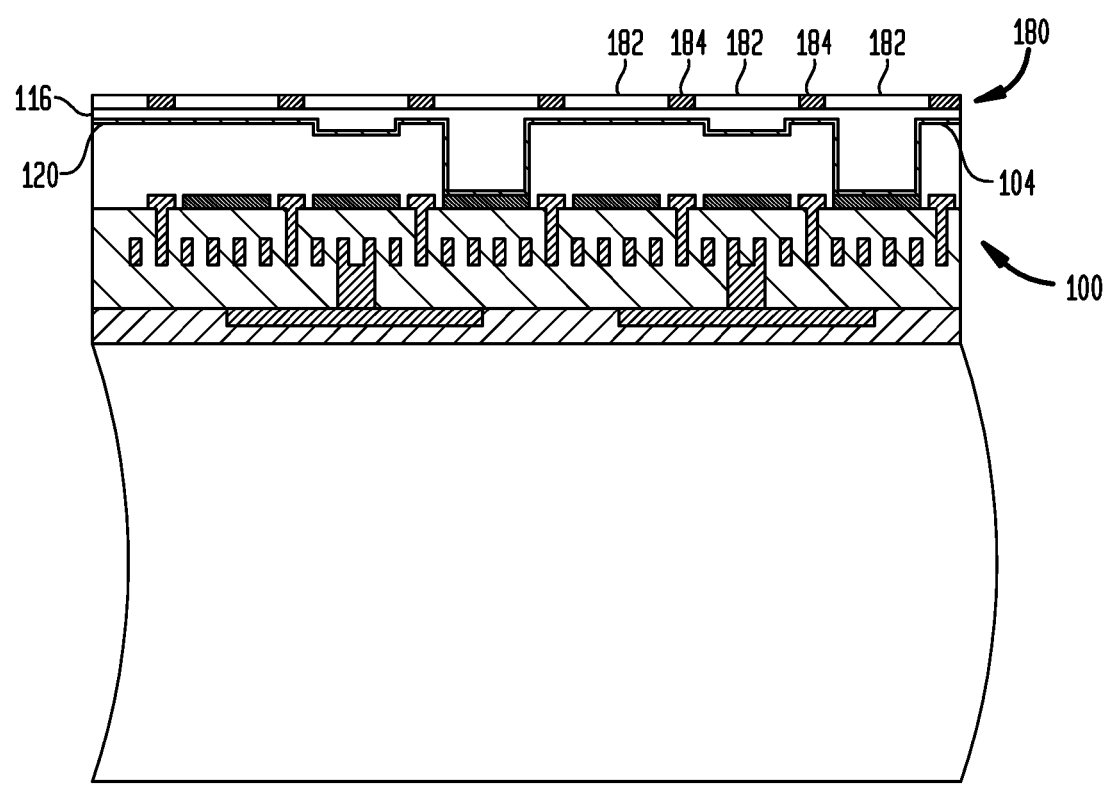
FIG. 5 is a sectional view of the element of FIG. 3 having a metal grid.

As shown in FIG. 5, a metal grid 180 can be arranged to overlie light-absorbing material 116 and rear face 104. Metal grid 180 typically define apertures 182 overlying each LSE 114 to allow light to pass through grid 180 via apertures 182 to reach each respective LSE 114. Portions 184 of grid 180 are comprised of metal and are arranged to block transmission of light between spaces overlying adjacent LSEs 114. Portions 184 serve to reduce or substantially eliminate cross-talk of the passing light between adjacent LSEs 114.

Figure 6:
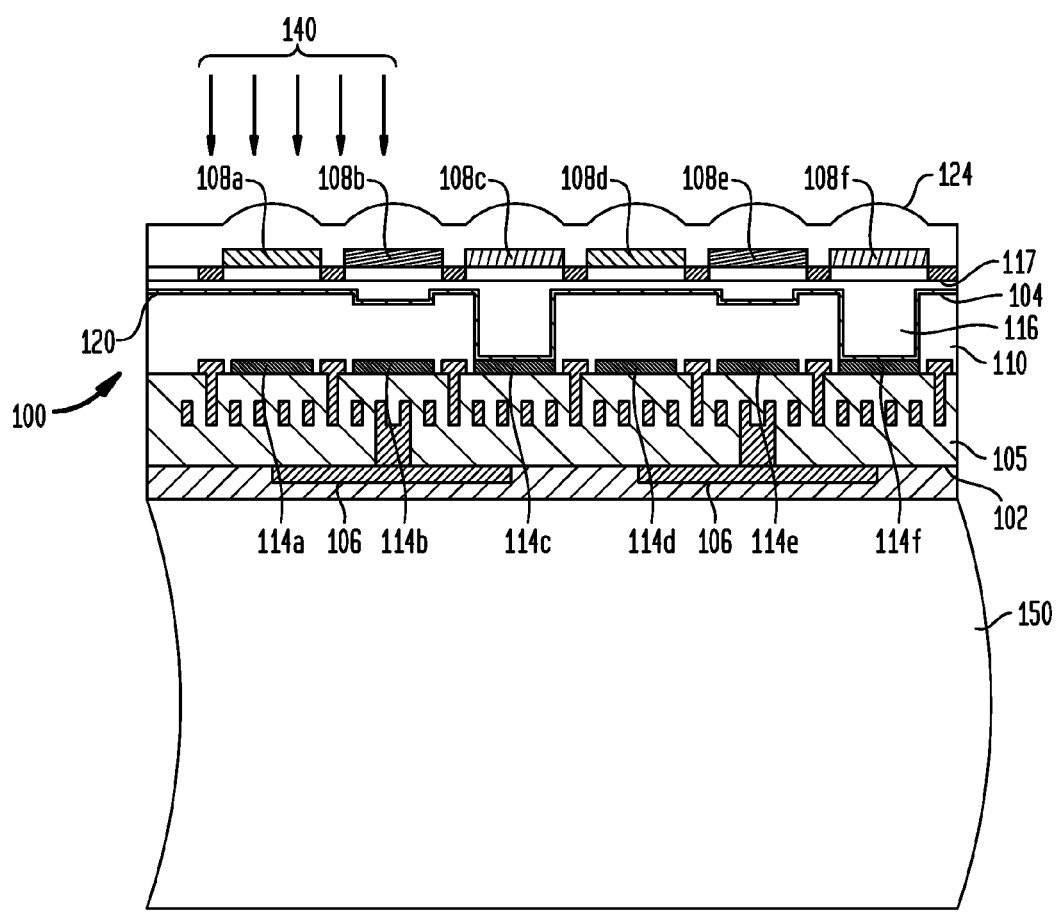
FIG. 6 is a sectional view of the element of FIG. 5 having a color filter array.

FIG. 6 illustrates the formation of a color filter array above the LSEs including filters 108a, 108b, 108c, etc., above respective ones of LSEs 114a, 114b, 114c, etc. The filters are exposed at or above the substantially planar surface 117 of the microelectronic element 100. FIG. 6 also illustrates the addition of an array of microlenses including microlens 124 overlying a respective LSE of the array of LSEs 114a-f. In further processing (FIG. 7), a wafer-sized transparent cover or other element 160 can be mounted above the rear face 104 of the wafer and be supported thereon by supporting structure 164. Conductive elements 158, 159 can be formed which extend from contacts 106 and are exposed at an exterior face 154 of the microelectronic assembly 110. A method of forming the conductive elements can be as described in one or more of the following commonly owned applications, the disclosures of which are incorporated herein by reference: U.S. Publication No. 2008/0246136 and U.S. Application Nos. 61/419,033 and 61/419,037. When a wafer-level fabrication method is used to produce the structure shown in FIG. 7 as contemplated in one embodiment herein, the structure at this stage of fabrication can include a device wafer including a plurality of microelectronic elements 100, a transparent cover element 160 or transparent wafer overlying the substantially planar surfaces of the microelectronic elements therein, and a carrier wafer, passive wafer or other substrate 150 overlying the front face 102 of the device wafer. The structure can be severed into a plurality of individual microelectronic assemblies 10, each including a microelectronic element 100, a transparent element 160 supported above the rear face of such microelectronic element, and a portion of the substrate 150 overlying the front face of such microelectronic element 100.

As seen in FIG. 7, areas of different thicknesses 112 can be separated by a wall portion 132 having greater thickness than the thicknesses 112b, 112c in the adjacent openings. In the variation of the embodiment shown in FIG. 8, an assembly 50 has elements 514a-f and different thicknesses 512 but omits the wall portions that separate openings such as wall portions 132 (FIG. 7). In another embodiment, an assembly can include a semiconductor region having rounded portions adjacent each edge of an LSE 514, such as in locations 690, and a slanted surface between the differently dimensioned openings. Such rounded portions may make manufacture of assembly 50 easier, and may result from the etching process.

Figure 8:
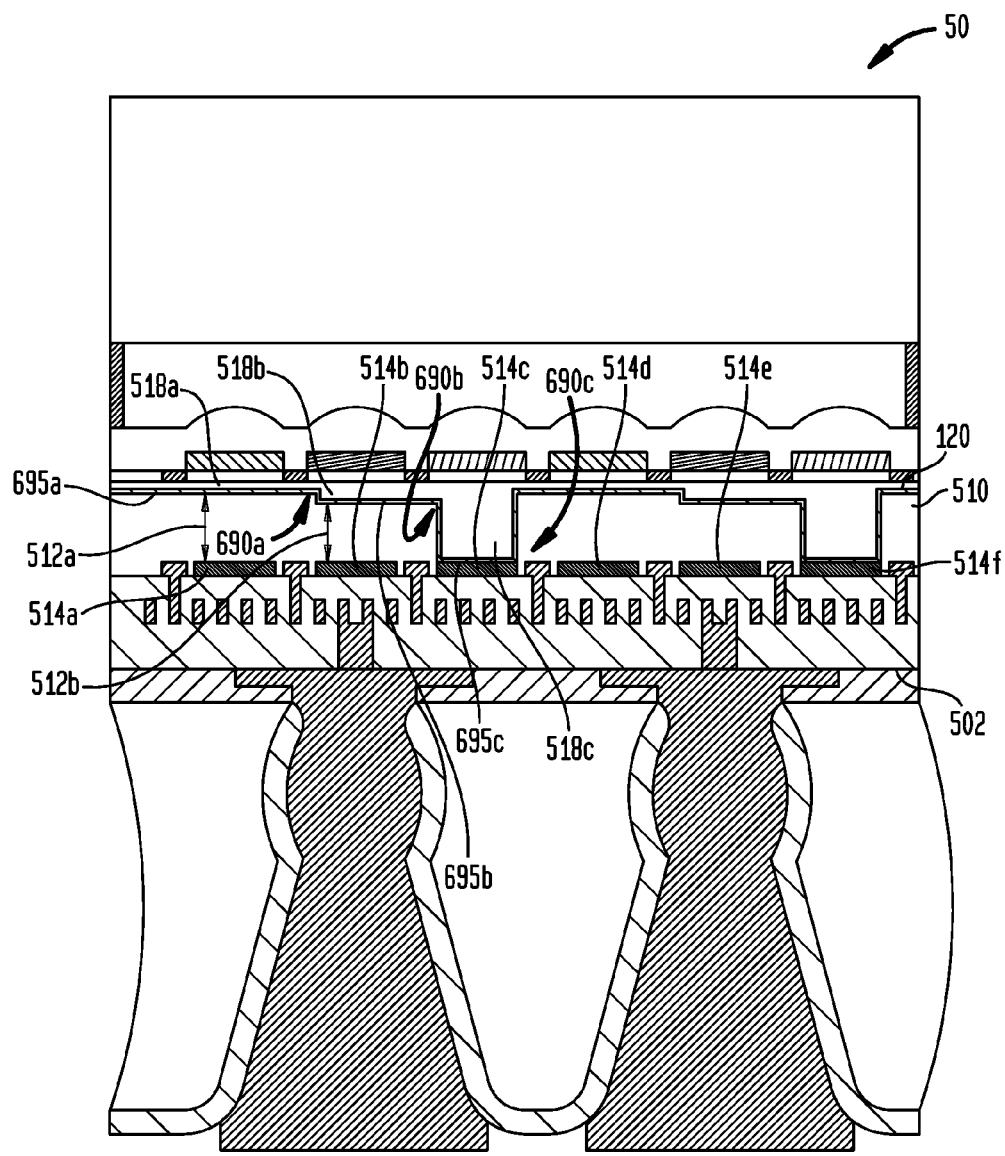
FIG. 8 is a sectional view of another embodiment of a microelectronic image sensor assembly in accordance with the present invention.

In other embodiments, the surfaces at the bottom of openings 518 may be slanted with respect to the underlying light sensing elements 514. For example, a bottom surface 695a of opening 518a (as shown in FIG. 8) can extend between an area adjacent the left edge of LSE 514a and location 690a. A bottom surface 695b of opening 518b can extend between location 690a and location 690b, and a bottom surface 695c of opening 518c can extend between locations 690b and 690c. Any or all of bottom surface 695a-c may be slanted with respect to front face 502. The angle of inclination between a bottom surface 695 and the front face 502 may be the same as or different from an angle of inclination of an adjacent surface. Preferably, in an embodiment with slanted or angled bottom surfaces 695, the angles are calculated and manufactured such that the total amount of absorption across bottom surface 695 is equivalent to the absorption in an embodiment such as assembly 50.

Figure 9:
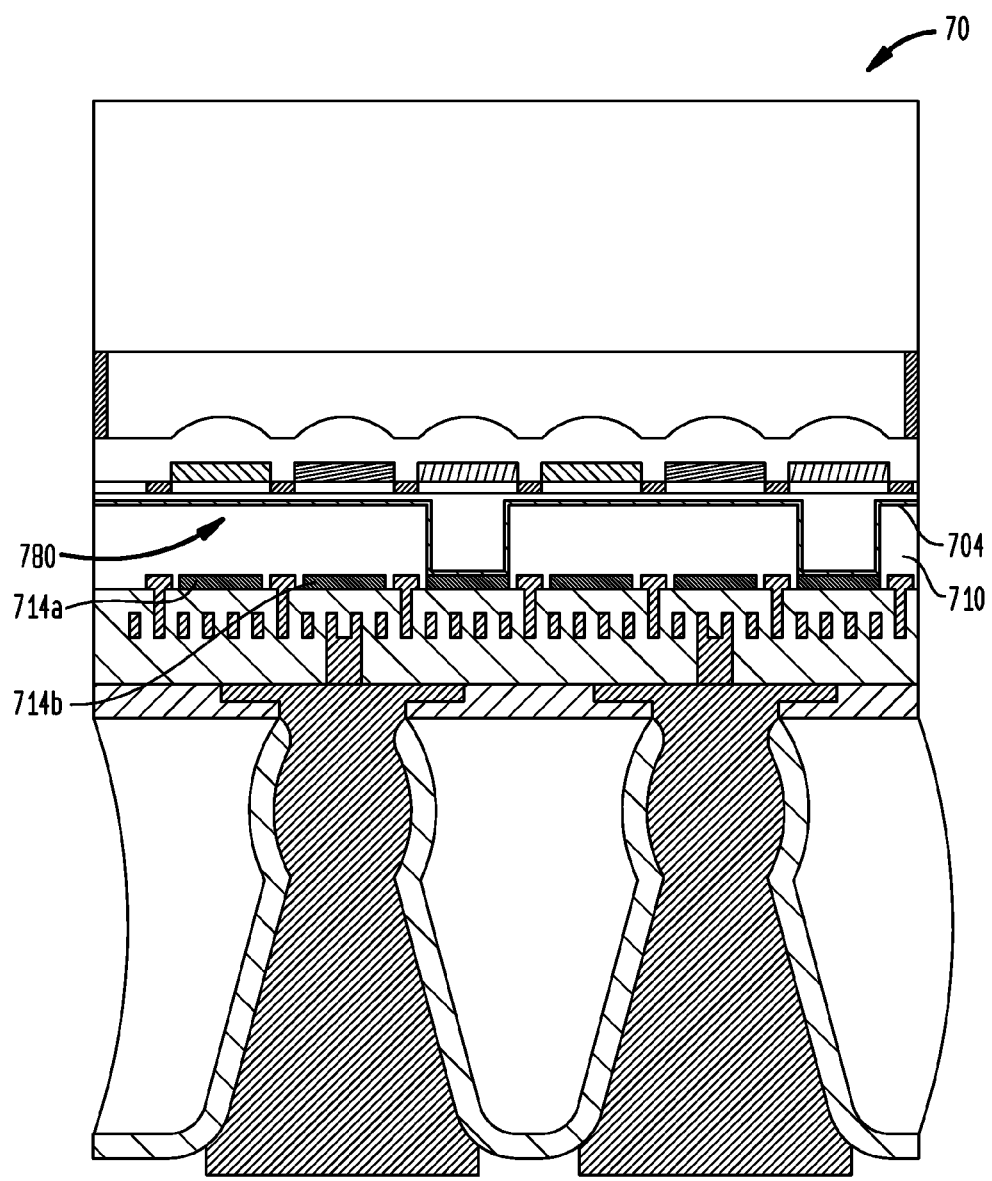
FIG. 9 is a sectional view of another embodiment of a microelectronic image sensor assembly in accordance with the present invention.
Figure 9A:
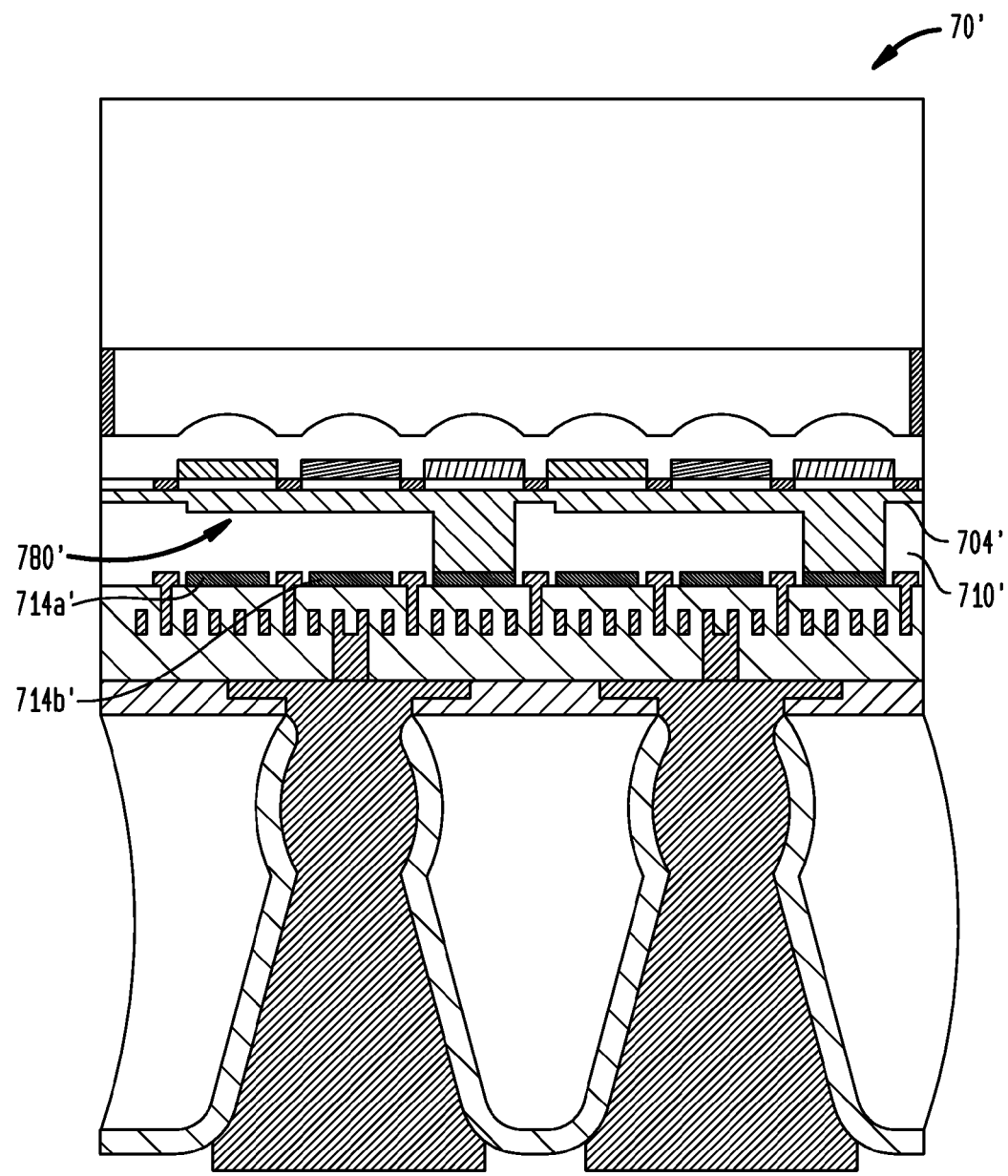
FIG. 9A is a sectional view of another embodiment of a microelectronic image sensor assembly in accordance with the present invention.

In another embodiment depicted in FIG. 9, an assembly 70 can have openings overlying two or more light sensing elements 714 patterned to substantially the same depth. Such may be the case where the wavelengths of light associated with such adjacent elements are similar, or are near enough in range so as to still provide for relatively even absorption among such elements with other elements in the assembly. For example, the absorption rates of blue and green light in silicon are similar, with blue being absorbed at about 1.5 times the rate that green is absorbed. Therefore, a single opening 780 having uniform depth can be formed overlying the LSEs 714a, 714b which receive blue and green light, respectively, such that the semiconductor region has the same thickness over both LSEs 714a, 714b. Of course, if semiconductor region 710 is not patterned at its rear face 704 overlying LSEs 714a, 714b, opening 780 may have a floor that is substantially co-planar with rear face 704, as shown in FIG. 9. In such case, the depth of opening 780 is essentially zero. In a further embodiment depicted in FIG. 9A, an assembly 70' can have an opening 780' patterned in semiconductor region 710' to a uniform depth overlying LSEs 714a', 714b', such depth being non-zero with respect to rear face 704'.

Figure 10:
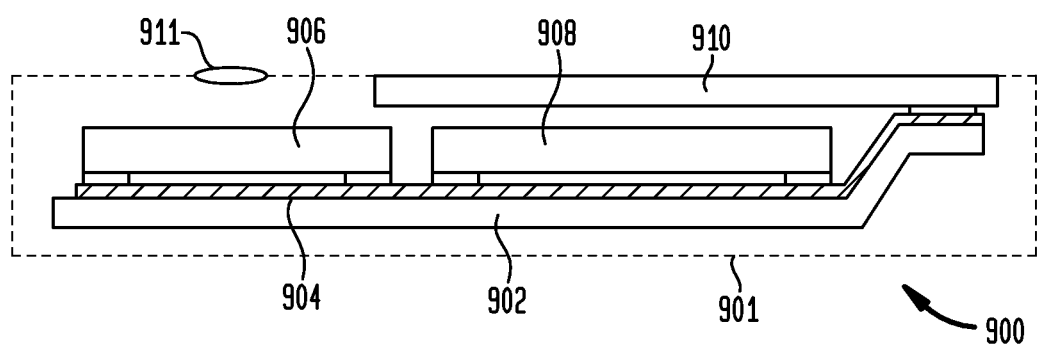
FIG. 10 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 10 for clarity of illustration, the system may include any number of such components. The structure 906 as described above may be, for example, a composite chip as discussed above or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 10, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 908 includes a light-sensitive element such as an imaging chip, a lens 911 or other optical device also may be provided for routing light to the structure. Again, the simplified system shown in FIG. 10 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of embodiments should be taken by way of illustration rather than by way of limitation of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic image sensor assembly, comprising:
a microelectronic element having a front face, contacts exposed at the front face, a semiconductor region having a first surface adjacent the front face, and the microelectronic element having a rear face remote from the front face, and substantially identical first and second light sensing elements arranged on a planar circuitry portion of the semiconductor region to receive light of first and second different wavelengths, respectively, through the rear face,
wherein the semiconductor region has an opening overlying at least the second light sensing element such that the semiconductor region has a first thickness between the first light sensing element and the rear face and a second thickness less than the first thickness between the second light sensing element and the rear face, and wherein the planar circuitry portion is disposed between the light sensing elements and the front face and is configured to electrically couple the light sensing elements to the contacts,
the microelectronic element further including a light-absorbing material overlying the semiconductor region at least within the opening above the second light sensing element, the light-absorbing material having a higher light absorption value per unit depth for absorbing light of at least the second wavelength than the semiconductor region, the first and second thicknesses and the light-absorbing material being selected such that the light of the first and second different wavelengths are able to pass through the semiconductor region and/or the light-absorbing material and reach the first and second light sensing elements with substantially the same intensity.

2. The assembly of claim 1, further comprising an antireflective coating overlying the rear face of the semiconductor region, wherein the light-absorbing material overlies the antireflective coating.

3. The assembly of claim 1, wherein the first and second different wavelengths correspond to different colors of light selected from the group consisting of red, blue, and green.

4. The assembly of claim 1, wherein a surface of the semiconductor region is exposed at the rear face of the microelectronic element and the light-absorbing material is at least substantially co-planar with the surface of the semiconductor region.

5. The assembly of claim 1, further comprising a third light sensing element arranged to receive light of a third wavelength different from the first and second wavelengths through the rear face,
wherein the semiconductor region has a third thickness between the third light sensing element and the rear face which is less than the second thickness,
wherein the light-absorbing material overlies the semiconductor region above the third light sensing element and has a higher light absorption value per unit depth for absorbing light of the third wavelength than the semiconductor region,
such that the third light sensing element is arranged to receive the light having the third wavelength with substantially the same intensity as each of the first and second light sensing elements are arranged to receive the first and second wavelengths, respectively.

6. The assembly of claim 5, wherein the first, second, and third wavelengths correspond to different colors selected from the group consisting of red, blue, and green.

7. The assembly of claim 6, wherein the first wavelength of light corresponds to blue light.

8. The assembly of claim 7, wherein the second wavelength of light corresponds to green light and the third wavelength corresponds to red light, and wherein the first thickness is more than 5 times the third thickness and the second thickness is at least 1.5 times the third thickness.

9. The assembly of claim 1, wherein the second thickness is zero.

10. The assembly of claim 1, wherein:
the light-absorbing material is arranged to reduce an amount of light passed to one or more of the light sensing elements; and
the semiconductor region comprises rounded portions and/or slanted surfaces adjacent each edge of at least the second light sensing element.

11. The assembly of claim 1, further comprising a substrate mounted to the front face of the microelectronic element, the substrate having a coefficient of thermal expansion of less than 10 parts per million/° C. ("ppm/° C."), and conductive elements extending from the contacts of the microelectronic element through the substrate and exposed at a surface of the substrate remote from the microelectronic element, the conductive elements including unit contacts.

12. The assembly of claim 1, further including a color filter array including at least a first filter and a second filter overlying the first and second light sensing elements, respectively, the first and second filters having first and second different passbands selecting the first and second wavelengths, respectively.

13. The assembly of claim 12, wherein the first and second wavelengths correspond to different ones of: red, blue, or green wavelengths.

14. The assembly of claim 12, further including an array of microlenses including first and second microlenses overlying the first and second filters, respectively.

15. The assembly of claim 14, further including a transparent cover overlying the microlenses, a cavity being disposed between the transparent cover and the microlenses.

16. The assembly of claim 1, further comprising one or more other electronic components electrically connected to the assembly.

17. The assembly of claim 16, further comprising a housing, wherein the assembly and the other electronic components are mounted to the housing.

18. A method of making a microelectronic image sensor assembly, comprising:
patterning a rear face of a semiconductor region of a microelectronic element having contacts exposed at a front face of the microelectronic element opposite the rear face, the microelectronic element having substantially identical first and second light sensing elements adjacent the front face, the first and second light sensing elements arranged on a planar circuitry portion of the semiconductor region to receive light of first and second different wavelengths, respectively, through the rear face, the patterning performed such that the semiconductor region has an opening overlying at least the second light sensing element, such that the semiconductor region has a first thickness overlying the first light sensing element and a second thickness less than the first thickness overlying the second light sensing element, and such that the planar circuitry portion is disposed between the light sensing elements and the front face and is configured to electrically couple the light sensing elements to the contacts; and forming a light-absorbing material region at least within the opening above the second light sensing element, the light-absorbing material having a higher light absorption value per unit depth for absorbing light of at least the second wavelength than the semiconductor region, the first and second thicknesses and the light-absorbing material being selected such that the light of the first and second different wavelengths are able to pass through the semiconductor region and/or the light-absorbing material and reach the first and second light sensing elements with substantially the same intensity.

19. The method of claim 18, further comprising forming an antireflective coating overlying the semiconductor region prior to the step of forming the light-absorbing material region, wherein the light-absorbing material region is formed over at least a portion of the antireflective coating.

20. The method of claim 18, wherein the first and second wavelengths correspond to different colors of light selected from the group consisting of red, blue, and green.

21. The method of claim 18, wherein the step of patterning includes forming a first opening overlying the first and second light sensing elements and then from within the first opening forming a second opening overlying the second light sensing element.

22. The method of claim 18, wherein the microelectronic element includes a third light sensing element arranged to receive light of a third wavelength different from the first and second wavelengths through the rear face, wherein the step of patterning the semiconductor region is performed such that the semiconductor region has a third thickness less than the second thickness between the third light sensing element and the rear face, and the step of forming the light-absorbing material region forms at least a portion of the light-absorbing material region overlying the third light sensing element, the light-absorbing material having a higher light absorption value per unit depth for absorbing light of the third wavelength than the semiconductor region, such that the third light sensing element is arranged to receive the light having the third wavelength with substantially the same intensity as each of the first and second light sensing elements are arranged to receive the first and second wavelengths, respectively.

23. The method of claim 22, wherein the first, second, and third wavelengths correspond to different colors selected from the group consisting of red, blue, and green.

24. The method of claim 18, wherein:
the step of forming the light-absorbing material region includes forming the light-absorbing material to reduce an amount of light passed to one or more of the light sensing elements; and the step of patterning the rear face of the semiconductor region comprises patterning rounded portions and/or slanted surfaces adjacent each edge of at least the second light sensing element.

25. The method of claim 18, further comprising
mounting a substrate to the front face of the microelectronic element, the substrate having a coefficient of thermal expansion of less than 10 parts per million/° C. ("ppm/° C."), and forming conductive elements extending from the contacts of the microelectronic element through the substrate and exposed at a surface of the substrate remote from the microelectronic element, the conductive elements including unit contacts.

26. The method of claim 18, further including
providing a color filter array including at least a first filter and a second filter overlying the first and second light sensing elements, respectively, the first and second filters having first and second different passbands selecting the first and second wavelengths, respectively.

27. The method of claim 26, wherein the first and second wavelengths correspond to different ones of: red, blue, or green wavelengths.

28. The method of claim 26, further comprising forming an array of microlenses including first and second microlenses overlying the first and second filters, respectively.

29. The method of claim 28, further comprising mounting a transparent cover overlying the microlenses, a cavity being disposed between the transparent cover and the microlenses.

* * * * *